United States Patent
Nuss et al.

(10) Patent No.: US 8,854,846 B2
(45) Date of Patent: Oct. 7, 2014

(54) METHOD AND APPARATUS FOR DETERMINING A FAULT CURRENT PORTION IN A DIFFERENTIAL CURRENT

(71) Applicant: SMA Solar Technology AG, Niestetal (DE)

(72) Inventors: Alexander Nuss, Kassel (DE); Christian Bode, Rollshausen (DE); Wilfried Groote, Vellmar (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 14/053,719

(22) Filed: Oct. 15, 2013

(65) Prior Publication Data

US 2014/0043880 A1     Feb. 13, 2014

Related U.S. Application Data

(63) Continuation of application No. PCT/EP2012/056705, filed on Apr. 12, 2012.

(30) Foreign Application Priority Data

Apr. 15, 2011 (DE) .......................... 10 2011 002 084

(51) Int. Cl.
*H02M 7/44* (2006.01)
*H02H 3/33* (2006.01)

(52) U.S. Cl.
USPC ........................ 363/56.02; 363/98; 324/522

(58) Field of Classification Search
USPC .................... 363/55–56.12, 98, 132; 324/522
See application file for complete search history.

(56) References Cited

U.S. PATENT DOCUMENTS

| 4,871,971 A | 10/1989 | Jeerings et al. |
| 6,289,267 B1 | 9/2001 | Alexander et al. |

(Continued)

FOREIGN PATENT DOCUMENTS

| DE | 19826410 A1 | 1/1999 |
| DE | 19937061 A1 | 2/2001 |

(Continued)

OTHER PUBLICATIONS

Blaabjerg, F. et al. "Power Electronics—Key Technology for Renewable Energy Systems." IEEE Power Electronics, Drive Systems, and Technologies Conference (PEDSTC). Feb. 16, 2011.

(Continued)

*Primary Examiner* — Jessica Han
(74) *Attorney, Agent, or Firm* — Eschweiler & Associates, LLC

(57) ABSTRACT

When determining a fault current portion $I_F$ in a differential current $i_{diff}(t)$ measured by an inverter, an AC voltage $u_{AC}(t)$ applied to an AC output of the inverter is measured and a periodic reference function $y(t)$ of alternating sign is generated as a function of the measured AC voltage $u_{AC}(t)$ in order to determine an AC fault current portion $I_{F_{AC}}$ in the differential current $i_{diff}(t)$. The differential current $i_{diff}(t)$ is multiplied by the periodic reference function $y(t)$, and the product of the differential current $i_{diff}(t)$ and the reference function $(y(t))$ is averaged over an integral number of periods of the reference function $y(t)$. The reference function $y(t)$, at least for one operating state of the inverter, is generated with a predefined phase offset with respect to the measured AC voltage $u_{AC}(t)$ and/or with a frequency which is an integer multiple of the frequency of the measured AC voltage $u_{AC}(t)$.

26 Claims, 2 Drawing Sheets

(56) References Cited

U.S. PATENT DOCUMENTS

| | | | |
|---|---|---|---|
| 6,392,422 B1 | 5/2002 | Kammer et al. | |
| 6,496,397 B2 * | 12/2002 | Sakai et al. | 363/131 |
| 6,611,441 B2 * | 8/2003 | Kurokami et al. | 363/56.02 |
| 6,747,856 B1 | 6/2004 | Huber et al. | |
| 6,930,868 B2 | 8/2005 | Kondo et al. | |
| 7,403,364 B2 * | 7/2008 | Anderson et al. | 361/79 |
| 7,760,518 B2 * | 7/2010 | Baurle et al. | 363/19 |
| 2002/0105765 A1 | 8/2002 | Kondo et al. | |
| 2013/0043880 A1 | 2/2013 | Bettenwort et al. | |

FOREIGN PATENT DOCUMENTS

| | | | |
|---|---|---|---|
| DE | 10215019 A1 | 12/2003 | |
| DE | 10253864 A1 | 6/2004 | |
| EP | 1229629 A2 | 8/2002 | |
| EP | 2372857 A1 | 10/2011 | |
| GB | 2258095 A | 1/1993 | |
| WO | 9858432 | 12/1998 | |
| WO | 2005050229 A1 | 6/2005 | |

OTHER PUBLICATIONS

International Search Report dated Aug. 9, 2012 for International Application No. PCT/EP2012/056705. 3 Pages.
"Automatic Disconnection Device Between a Generator and the Public Low-Voltage Grid"; Prestandard; DIN V VDE V 0126-1-1; VDE-Vornorm; Feb. 2006; p. 1-15.

* cited by examiner

METHOD AND APPARATUS FOR DETERMINING A FAULT CURRENT PORTION IN A DIFFERENTIAL CURRENT

CROSS-REFERENCE TO RELATED APPLICATIONS

This Application is a Continuation of International Application number PCT/EP2012/056705 filed on Apr. 12, 2012, which claims priority to German Application number 10 2011 002 084.5 filed on Apr. 15, 2011.

FIELD

The disclosure relates to a method for determining a fault current portion in a differential current which is measured at an inverter, and to a device for executing such a method.

BACKGROUND

The standard VDE 0126-1-1 requires that an inverter separate itself from the grid within specified switch-off terms on the basis of the effective value of a differential current suddenly occurring over its grid connections. This differential current consists of a resistive fault current and an additional capacitive leakage current which vectorially add up to the differential current. From the specifications of the normative test setup and test procedure for fulfilling the standards it can be taken that a stepwise increase of the fault current alone has to result in a separation of the inverter from the grid, even with a high leakage current being present. For this purpose, it is necessary to determine the fault current portion in the differential current.

In an inverter, the differential current is usually measured with a summation current transformer whose voltage signal is a measure of the differential current between the phases and the zero conductor of the inverter. Due to the tendency to develop transformer-less inverters with increasing power and bigger dimensions of the photovoltaic installations, the capacitances with regard to earth and thus the leakage currents increase. Due to the use of certain materials for the photovoltaic installation, this tendency is additionally increased. Further, the leakage capacitances, like for example in case of a photovoltaic installation as the DC source, are not constant but change inter alia with rainfall onto the photovoltaic panels. For the purpose of sufficiently sensitively recognizing a step in the fault current, it is thus required to continuously separate the leakage current portion from the differential current.

For the purpose of separating leakage currents from the voltage signal of a summation current transformer, it is known to define all slowly varying currents which are measured by the summation current transformer as leakage currents, and to compensate them by an evaluation software. Occurring steps of the fault current may then be calculated vectorially. In this approach, however, steps in the leakage current are erroneously interpreted as fault currents.

A method and a device for insulation and fault current monitoring in an electric AC power grid are known from WO 98/58432 A1. Here, the differential current between the grid lines which is formed by vectorial addition is measured. An alternating current portion in this differential current is determined. As a second grid value, the grid AC voltage between at least two line conductors or between a line conductor and a potential compensation conductor or a zero conductor is measured. Then, the product of the amplitude of the AC current portion in the differential current and the cosine of the phase angle φ between the two measured grid values is determined as a measure of the resistive fault current. This determination may be executed by a multiplication of the AC current portion in the differential current by a multiplication signal and a successive arithmetic formation of an average value, wherein the multiplication signal corresponds to the AC grid voltage whose effective value is kept constant. In case of expanding this known method to a multi-phase AC power grid, the mentioned steps shall be separately executed for each of the three line conductors in that the AC current portion in the differential current of all three line conductors is measured, in that, further, the three grid AC voltages between each line conductor and a zero conductor or a potential equalization conductor are measured, and in that the respective three products of the amplitude of the alternating current portion of the differential current and the cosine values of the three phase angles φ are determined. While the method disclosed is generally applicable to a single-phase inverter, it turns out that the alternating fault current portion in a differential current which is measured at a multi-phase inverter can not be correctly determined in this way. Even with a single-phase inverter, operation conditions occur in which the alternating fault current portion in the measured differential current is not correctly determined by the known method.

There still is a need of a method for determining a fault current portion in a differential current measured at an inverter and an apparatus for executing such a method, by which at least the alternating fault current portion and desirably also the entire fault current portion in the differential current is correctly determined.

SUMMARY

The disclosure provides a method of determining a fault current portion $I_F$ in a differential current $i_{diff}(t)$. The method comprises measuring the differential current $i_{diff}(t)$ at an inverter, measuring an AC voltage $u_{AC}(t)$ present at an AC current output of the inverter, and generating a periodic reference function $y(t)$ of alternating sign as a function of the measured AC voltage $u_{AC}(t)$. The method further comprises multiplying the differential current $i_{diff}(t)$ by the reference function $y(t)$, and averaging the product of the differential current $i_{diff}(t)$ and the reference function $y(t)$ over an integral number of periods (T) of the reference function $y(t)$ for determining an AC fault current portion $I_{F_{AC}}$ in the differential current $i_{diff}(t)$. The generated reference function $y(t)$, at least for one operating state of the inverter, has at least a predefined phase offset with respect to the measured AC voltage $u_{AC}(t)$ or at a frequency which is an integral multiple of the frequency of the measured AC voltage $u_{AC}(t)$.

Further, the disclosure provides an apparatus for determining a fault current portion $I_F$ in a differential current $i_{diff}(t)$. The apparatus comprises a summation current transformer configured to measure a differential current $i_{diff}(t)$ at an inverter, a measurement device configured to measure an AC voltage $u_{AC}(t)$ present at an AC current output of the inverter, and a signal generator configured to generate a periodic reference function $y(t)$ of alternating sign as a function of the measured AC voltage $u_{AC}(t)$. The signal generator, at least for one operating state of the inverter, generates the reference function $y(t)$ with at least a predefined phase offset with respect to the measured AC voltage $u_{AC}(t)$ or at a frequency which is an integral multiple of the frequency of the measured AC voltage $u_{AC}(t)$. The apparatus further comprises a multiplication knot configured to multiply the differential current $i_{diff}(t)$ by the reference function $y(t)$, and an averager configured to form an average value of the product of the multiplication knot over an integral number of periods T of reference function y(t).

Advantageous developments of the disclosure result from the claims, the description and the drawings. The advantages of features and of combinations of a plurality of features mentioned at the beginning of the description only serve as examples and may become effective alternatively or cumulatively, without the necessity of embodiments according to the disclosure having to achieve these advantages. Further features may be taken from the drawings, in particular from the relative arrangements and the operative connections. The combination of features of different embodiments of the disclosure or of features of different claims, independent of the chosen references of the claims, is also possible, and it is motivated herewith. This also applies to features which are illustrated in separate drawings, or which are mentioned when describing them. These features may also be combined with features of different claims. Likewise, further embodiments of the disclosure may do without features mentioned in the claims.

BRIEF DESCRIPTION OF THE DRAWINGS

In the following, the disclosure, with reference to the attached drawings, is further explained and described by means of example embodiment.

DETAILED DESCRIPTION

Figure 1:
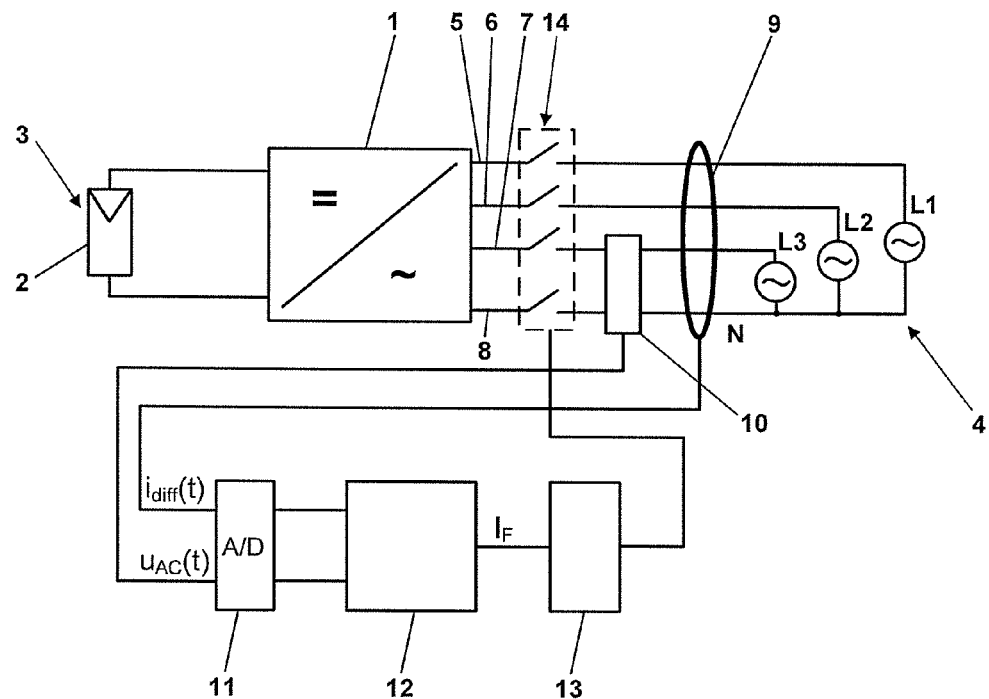
FIG. 1 shows an inverter comprising an apparatus of the disclosure for executing the method of the disclosure.

In a method according to the present disclosure for determining a fault current portion in a differential current which is measured at an inverter, for the purpose of determining an AC fault current portion in the differential current: (i) an AC voltage present at the AC output of the inverter is measured, (ii) a periodic reference function of alternating sign is generated as a function of the measured AC voltage, (iii) the differential current is multiplied by the periodic reference function, and (iv) the product of the differential current and the reference function is averaged over an integral number of periods of the reference function. In doing so, the reference function, at least for one operating state of the inverter, is generated with a predefined phase offset with respect to the measured AC voltage and/or at a frequency which is an integral multiple of the frequency of the measured AC voltage $u_{AC}(t)$. I.e., at least for the one operating state of the inverter, the reference function differs from the measured AC voltage in its phase and/or in its frequency in a defined way.

In one embodiment, the inverter inverts a direct current provided by a DC source into an alternating current. This AC source may be a photovoltaic installation which, already due to its spatial extent, has a considerable leakage capacitance with respect to earth. Leakage currents towards earth result from this leakage capacitance and from potential variations with respect to earth which occur in operation of the inverter. These leakage currents are found in a differential current which is regularly monitored for quickly recognizing the occurrence of fault currents. Thus, high leakage currents cause the sensitivity in recognizing fault currents by monitoring the differential current to be reduced. Thus, it is a matter of interest to determine the actual fault current portion in a differential current.

The present disclosure is based on the finding that it is not sufficient for determining a fault current portion in the differential current measured at an inverter to assume potential variations at the DC current side of the inverter which have the frequency and phase of AC voltages measured at one or more outputs. This at least applies to certain operating states of nearly all inverters and to all operating states of multi-phase inverters. In order to anticipate the relevant potential variations at the AC side of the inverter, a reference function is generated as a function of the AC voltage measured at an output of the inverter even in the method of the disclosure. This reference function, however, at least for certain operating states of the inverter, comprises a predefined phase offset and, particularly for many operating states of multi-phase inverters, a frequency which is a low integral multiple different from one of the individual AC voltages at the AC outputs.

The operating states in which the predefined phase offset is used are typically those in which semiconductor switches with anti-parallel diodes of an inverter bridge of the inverter are not switched, i.e. in which the inverter bridge only passively connects the AC side of the inverter via the anti-parallel diodes with all outputs of the inverter at which AC voltages are present. Here, a typical phase offset of the resulting potential variations at the DC current side of the inverter occurs with respect to one or more AC voltages which are present at the output(s) of the inverter. This phase offset is predetermined by the operating state of the inverter and can be determined in a theoretical way. The phase offset may also be determined in that, in executing the method of the disclosure, the AC fault current portion is minimized in an inverter which is definitively free of faults by variation of the phase offset of the reference function with respect to the measured AC voltage. The phase offset determined in this way may then be preset for this operating state in a fixed way.

In the already mentioned operating state in which semiconductor switches with anti-parallel diodes of an inverter bridge of the inverter are not switched, the dominant potential variation at the DC current side of the inverter, even in a single-phase inverter, may be increased by, for example, a factor of two with regard to the frequency of the AC voltage measured at an output. Further, even in normal operation of many multi-phase inverters, it turns out that potential variations occur at their DC current side which do not have the frequency of the individual AC voltages at the AC current outputs of the inverter, but a frequency which is in an integral ratio greater than 1 to the frequency of the individual AC voltages at the AC current outputs. Particularly with three-phase inverters, potential variations of three times the frequency of the individual AC voltages at the AC outputs regularly occur at the DC current side, which—for example in case of an insulation fault—cause resistive currents toward ground which are found in the measured differential current. Correspondingly, the frequency of the relevant AC fault current portion is three times the frequency of the individual AC voltages at the AC current outputs then. Thus, the frequency of the reference function to be set for a particular application may be determined in a theoretical way from the properties of the AC voltages at the AC current outputs or else by evaluating the regularly present differential currents. In a single-phase inverter, the frequency of the relevant potential variations at its DC current side, in certain operating states, may, besides once the frequency of the AC voltage at its AC current output, also be twice this frequency. In a two-phase inverter, particularly in such a one which is connected to a split-phase net according to US standards, the frequency of the relevant potential variations at its DC current side may, besides once the frequency of the AC voltages at its AC current outputs, already in normal operation, be twice this frequency. Thus, there are often potential variations at the DC current side whose frequencies in an n-phase inverter are n times the frequency of the AC voltages at its AC current outputs. Sometimes, even potential variations at the DC current side of an n-phase inverter are relevant whose frequencies are 2n times and/or 3n times the frequency of the AC voltages at its AC current outputs.

In normal operation in which semiconductor switches with anti-parallel diodes of an inverter bridge of the inverter are switched to, for example, sine-shape the AC currents output by the inverter via pulse width modulation, the potential variations at the DC current side of the inverter are typically in phase with the AC voltages at the outputs of the inverter as a whole so that, in this operating state, the reference function, in the method according to the present disclosure, is generated in such a way that zero crossings of the reference function coincide with zero crossings of the measured AC voltage. If the reference function has a higher frequency than the AC voltage in this case, it also has additional zero crossings, which then typically coincide with zero crossings of other AC voltages at other outputs of the inverter.

By multiplying the differential current by a reference function which varies in phase with the anticipated potential variations and subsequently averaging over one period or an integral number of periods of this reference function, the AC current portion caused by the anticipated potential variations is deselected from the differential current and particularly separated from capacitive leakage currents and any DC current portions in the differential current. All capacitive leakage currents which are caused by the same potential variations have a phase offset of 90° or $\pi/2$ with respect to the potential variations such that their product with the reference function is 0 as a temporal average. Due to the alternation of sign of the reference function, even the product of all DC current portions in the differential current and the reference function is 0.

In the method of the disclosure, the differential current may be multiplied by at least one further periodic reference function whose frequency is in an integral ratio to the frequency of the reference function, wherein zero crossings of the further reference function coincide with zero crossings of the reference function, and the product of the differential current and the further reference function can be averaged over an integral number of periods of the further reference function for determining a further AC current portion in the differential current. If the frequency of the further reference function is twice as high as the frequency of the reference function, this further AC fault current portion considers an often essential first harmonic of an entire AC fault current portion in the differential current. Thus, particularly potential variations at twice the frequency of the potential variations over the entirety of the AC voltages at the AC current outputs of the inverter are present at the input side of the inverter. Resistive fault currents caused by them are represented by the further AC fault current portion which is determined by using the frequency-doubled reference function. Generally, the frequency of the further reference function may also be lower than that one of the reference function, if, for example, the reference function already represents potential variations at a multiple frequency of the potential variations over the entirety of the AC voltages at the AC current outputs of the inverter.

In one embodiment, for determining a total AC fault current portion in the differential current from individual AC fault current portions, the individual AC fault current portions of different frequencies are added up geometrically.

As an alternative to actually determining different wave portions, their relative amplitudes, under given conditions (type of inverter, PV power and similar) may also be estimated in that the AC fault current portion determined by means of the reference function for the dominating wave is multiplied by a scaling factor to determine an approximate value for the total AC fault current portion. If at least a measurement of the AC fault current portion of two waves, like for example the fundamental wave and one harmonic, is available, this scaling factor may be counter-checked by their relative amplitudes and modified if necessary.

In one embodiment the reference function is a sine function corresponding to the typical temporal course of potential variations at the DC current side of the inverter with sine-shaped AC voltages at its AC current outputs. The zero crossings of the sine functions are, for example, triggered by the zero crossings of the measured AC voltages. Here, each zero crossing triggers a zero crossing of the sine function, without or with the defined phase offset. For this purpose, at least the points in time of these zero crossings of the AC voltage which is present at an output of the inverter are measured in the method of the disclosure. Even if the zero crossings of the sine function are only triggered by the zero crossings of one of several AC voltages at several outputs of the inverter, they are in a defined phase relation to the zero crossings of all uniformly phase-shifted AC voltages.

If the reference function has a maximum value of $\sqrt{2}$, the average of the product of the differential current and the reference function directly is the effective value of the AC fault current portion in the differential current caused by potential variations at the frequency of the reference function at the DC current side of the inverter.

In one embodiment of the disclosure, the average formation for the determination of each AC fault current portion in the differential current takes place over an integral number of periods of the AC voltage measured at the AC current output of the inverter. In this way, the average covers any asymmetries between several AC voltages at the AC current outputs of the inverter, or it is not influenced by them. A geometric addition which has been mentioned above in the context of different AC fault current portions is also employed to determine a total fault current portion in the differential current which includes a DC fault current portion besides the total AC fault current portion. This DC fault current portion in the differential current itself may be determined by simply temporally averaging the differential current.

In the new method, all AC current outputs of the inverter, including a potential zero conductor, may be separated from an AC load connected to the inverter or from a connected AC power grid, and/or the inverter may be switched off, if the AC fault current portion or the DC fault current portion or the total fault current portion in the differential current exceeds a current threshold value for a minimum period of time. In this case, the current threshold value and the associated minimum period of time may correspond to the standards mentioned at the beginning.

In the method of the disclosure, the differential current can be measured at the inverter between all AC current outputs of the inverter. Generally, however, a measurement of the differential current over the input lines of the inverter is also possible. To adjust the reference function with regard to its phase to the zero crossings of the AC voltages, however, at least one of the AC voltages at one AC current output of the inverter has to be measured in the method of the disclosure.

An apparatus according to the disclosure for executing the method according to the disclosure includes: (i) a summation current transformer for measuring a differential current at an inverter, (ii) a device for measuring an AC voltage present at an AC current output of the inverter, (iii) a signal generator for generating a periodic reference function of alternating sign as a function of the measured AC voltage, (iv) a multiplication knot for multiplying the differential current by the reference function, and (v) an averager for forming an average value of the product of the multiplication knot over an integral number of periods of the reference function. Here, the signal generator is configured in such a way that the reference function, at least for one operating state of the inverter, is generated at a predefined phase offset with respect to the AC voltage and/or at a frequency which is an integral multiple of the frequency of the measured AC voltage.

Particularly, in one embodiment the signal generator may be a sine generator and may be triggered by the zero crossings of the AC voltage measured at the AC current output of the inverter.

The apparatus may further comprise an A/D converter for the differential current and the measured AC voltage. Then, the further components of the apparatus, including the signal generator, are digital.

For the purpose of also considering at least one further wave of the potential variations at the DC current side of the inverter, the apparatus may comprise a further multiplication knot and a further averager to multiply the differential current by a further reference function, for example doubled in frequency with respect to the reference function, and to form an average value of the product of the further multiplication knot over an integral number of periods of the further reference function. Generally, even further waves of higher or lower frequency may also be considered in the new apparatus as well as in the new method. For this purpose, the differential current is then to be multiplied with further reference functions.

In the new apparatus, the averaged products of the individual multiplication knots are geometrically added up in an adder. Such a geometric adder may also be provided for the addition of the temporally averaged value of the differential current formed by an averager.

Each averager may, for example be constructed as an integrator with a suitably adjusted integration time, but also as a low pass filter with a sufficiently low adjusted cut off frequency. In case of a digital construction of the averager, it may also in fact generate an average value over a number of individual values of the respective product, which correspond to a predetermined number of periods of the reference signal.

In an inverter according to the disclosure comprising a controller and an apparatus according to the disclosure for determining the fault current portion in a differential current measured at the inverter, the controller at least separates all AC current outputs of the inverter at which an AC voltage is present in normal fault-free operation of the inverter from an AC load or an AC power grid and/or switches the inverter off, if the averaged product of a multiplication knot or the averaged differential current or an output signal of a geometric adder exceeds a threshold value for a minimum period of time. Any existing zero conductor may also be separated. The threshold values given by the standards mentioned at the beginning of 30/60/150 mA which must not be exceeded for periods of time of 300/150/40 ms are easily surveyed according to the disclosure as even a minimum period of time of 40 ms, with a 50 Hz AC current, still includes two periods of the AC current, and as, correspondingly, with averaging over one period of the AC current, an occurring fault current is completely determined very promptly (without consideration of the signal run times, within 20 ms).

Now referring in greater detail to the drawings, FIG. 1 depicts an inverter 1 which, at its input side, is connected to a photovoltaic unit 2 as a DC current source 3. At its output side, the inverter is connected to a three-phase AC power grid 4. For this purpose, it comprises AC current outputs 5 to 8. Here, the AC current outputs 5 to 7 are provided for line conductors L1 to L3, and the AC current output 8 is provided for the zero conductor N of the three-phase AC power grid 4. Correspondingly, the three phase-shifted AC voltages $u_{AC}(t)$ of the AC power grid 4 are present at the AC current outputs 5 to 7. A summation current transformer 9 is provided for measuring the differential current $i_{diff}(t)$ between all AC current outputs 6 to 8 of the inverter 1. A measurement device 10 measures one of the three AC voltages $u_{AC}(t)$ at the output line 7 with respect to the zero potential at the AC current connector 8. The differential current $i_{diff}(t)$ and the AC voltage $u_{AC}(t)$ are digitized in an A/D converter 11 and then forwarded to an evaluation device 12 which determines a fault current $I_F$ based on the values supplied here. In an assessment device 13, this fault current is compared to threshold values, and in case of exceeding one of the threshold values for a period of time associated to the respective threshold value, a separation switch 14 is operated to disconnect the inverter from the AC power grid 4 with regard to all phases. The apparatus 9 to 13 made up by the summation current transformer 9, the measurement device 10, the A/D converter 11, the evaluation device 12 and the assessment device 13 thus measures the differential current $i_{diff}(t)$ at the inverter 1, determines the fault current $I_F$ on this basis, and separates the inverter 1 from the grid in case of threshold values for the fault current being exceeded, and it may additionally switch the inverter off.

Figure 2:
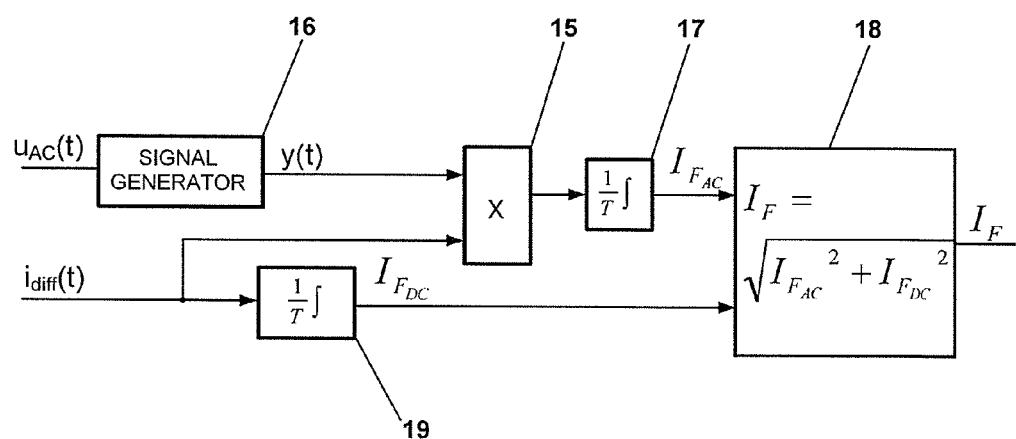
FIG. 2 shows a block diagram for executing the method of the disclosure.

The block diagram according to FIG. 2 shows the steps which are executed in the evaluation unit 12 according to one embodiment to determine the fault current $I_F$ on the basis of the measured differential current $i_{diff}(t)$. On the one hand, a DC fault current portion $I_{F_{DC}}$ is determined on the basis of the differential current $i_{diff}(t)$ in that an average value of the differential current $i_{diff}(t)$ is formed in an averager 19, which is indicated by integration over a period of time and successive division by the period of time. Additionally, in a multiplication knot 15, the differential current $i_{diff}(t)$ is multiplied by a periodic reference function y(t) of alternating sign which is generated by a signal generator 16 to which the AC voltage $u_{AC}(t)$ is supplied. The signal generator 16 generates the reference function y(t) as a sine function whose frequency, in the configuration depicted in FIG. 1, for example, corresponds to three times the frequency of the AC voltage $u_{AC}(t)$, wherein each zero crossing of the AC voltage $u_{AC}(t)$ triggers a zero crossing of the reference function y(t). Depending on the operating state of the inverter, the zero crossings of the reference function y(t) are additionally delayed by a predefined phase offset, which has, for example, been determined in advance. As the three alternating voltages of the inverter 1 according to FIG. 1 have same phase shifts with regard to each other, this means that the reference function y(t), at each zero crossing of each of the AC voltages at the AC current outputs 5 to 7 of the inverter 1, also has a zero crossing. The reference function y(t) represents the fundamental wave of the potential variations at the DC input side of the inverter 1 according to FIG. 1, and by its multiplication by the differential current $i_{diff}(t)$ in the multiplication knot 15 and a successive formation of an average value in an averager 17, the resistive AC fault current portion $I_{F_{AC}}$ in the differential current $i_{diff}(t)$, which is in phase with these potential variations, is determined. Finally, the DC fault current portion $I_{F_{DC}}$ and the AC fault current portion $I_{F_{AC}}$ are quadratically added up in a geometric adder 18 to obtain the fault current portion $I_F$.

The measured differential current $i_{diff}(t)$ inclusive of all harmonic contributions may be described by the following sum of Fourier series:

$$i_{Diff}(t) = a_0 + \sum_{k=1}^{\infty} a_k \sin(k\omega_0 t) + \sum_{k=1}^{\infty} b_k \cos(k\omega_0 t) \quad \text{(I)}$$

Here, the summand $a_0$ corresponds to the DC current portion in the differential current, the second summand corresponds to the overall AC fault current portion inclusive of all harmonic contributions, and the third summand corresponds to the capacitive leakage current portion which also is a AC current portion but has a phase shift of 90° with respect to the overall resistive AC fault current portion.

Multiplication by the sine function $y(t)=\sqrt{2}\cdot\sin(\omega_0 t)$, (i.e. the reference function y(t), having the maximum value or the amplitude $\sqrt{2}$ results in:

$$i_{Diff}(t) \cdot \sqrt{2} \cdot \sin(\omega_0 t) = a_0 \sqrt{2} \cdot \sin(\omega_0 t) + \quad \text{(II)}$$
$$\sum_{k=1}^{\infty} \sqrt{2} \cdot a_k \sin(k\omega_0 t) \cdot \sin(\omega_0 t) + \sum_{k=1}^{\infty} \sqrt{2} \cdot b_k \cos(k\omega_0 t) \cdot \sin(\omega_0 t)$$

Subsequent formation of an average value over the period T results in:

$$\frac{1}{T} \int_0^T i_{Diff}(t) \cdot \sqrt{2} \cdot \sin(\omega_0 t) dt = \quad \text{(III)}$$
$$\frac{1}{T} \int_o^T a_0 \sqrt{2} \cdot \sin(\omega_0 t) dt + \frac{1}{T} \int_o^T \sum_{k=1}^{\infty} \sqrt{2} \cdot a_k \sin(k\omega_0 t) \cdot \sin(\omega_0 t) dt +$$
$$\frac{1}{T} \int_o^T \sum_{k=1}^{\infty} \sqrt{2} \cdot b_k \cos(k\omega_0 t) \cdot \sin(\omega_0 t) dt$$

The following applies to the summands on the right hand side of the equation III:

$$\frac{1}{T} \int_o^T a_0 \sqrt{2} \cdot \sin(\omega_0 t) dt = 0 \quad \text{(IV)}$$

$$\frac{1}{T} \int_o^T \sum_{k=1}^{\infty} \sqrt{2} \cdot a_k \sin(k\omega_0 t) \cdot \sin(\omega_0 t) dt = 0 \mid k \neq 1$$

$$\frac{1}{T} \int_o^T \sum_{k=1}^{\infty} \sqrt{2} \cdot a_k \sin(k\omega_0 t) \cdot \sin(\omega_0 t) dt = \frac{1}{\sqrt{2}} \cdot a_1 \bigg| k = 1$$

$$\frac{1}{T} \int_o^T \sum_{k=1}^{\infty} \sqrt{2} \cdot b_k \cos(k\omega_0 t) \cdot \sin(\omega_0 t) dt = 0$$

As all summands except the fault current portion of the fundamental wave (k=1) are zero, it applies:

$$\left| \frac{1}{T} \int_0^T i_{Diff}(t) \cdot \sqrt{2} \cdot \sin(\omega_0 t) dt \right| = \quad \text{(V)}$$

$$\left| \frac{1}{\sqrt{2}} \cdot a_1 \right| = \left| \sqrt{\frac{1}{T} \int_0^T (a_1 \cdot \sin(\omega_0 t))^2 dt} \right| = I_{Fac}$$

Thus, after the multiplication of the measured differential current $i_{diff}(t)$ by the reference function y(t) and the average value formation, the result is the effective value of the AC fault current portion of the differential current $i_{diff}(t)$ at the frequency of the fundamental wave.

For calculating the harmonic content of the AC fault current portion in the differential current, one may proceed in an analogous way in that the frequency of the reference signal y(t) is multiplied by integer values (k>1) according to the considered order of the harmonic. I.e., a resulting further reference function $y'(t)=\sqrt{2}\cdot\sin(k\omega_0 t)$ may be used in the same way in which the reference function is used according to the above equations to determine a $k^{th}$ harmonic of the AC fault current portion $I_{F_{AC}}$.

Figure 3:
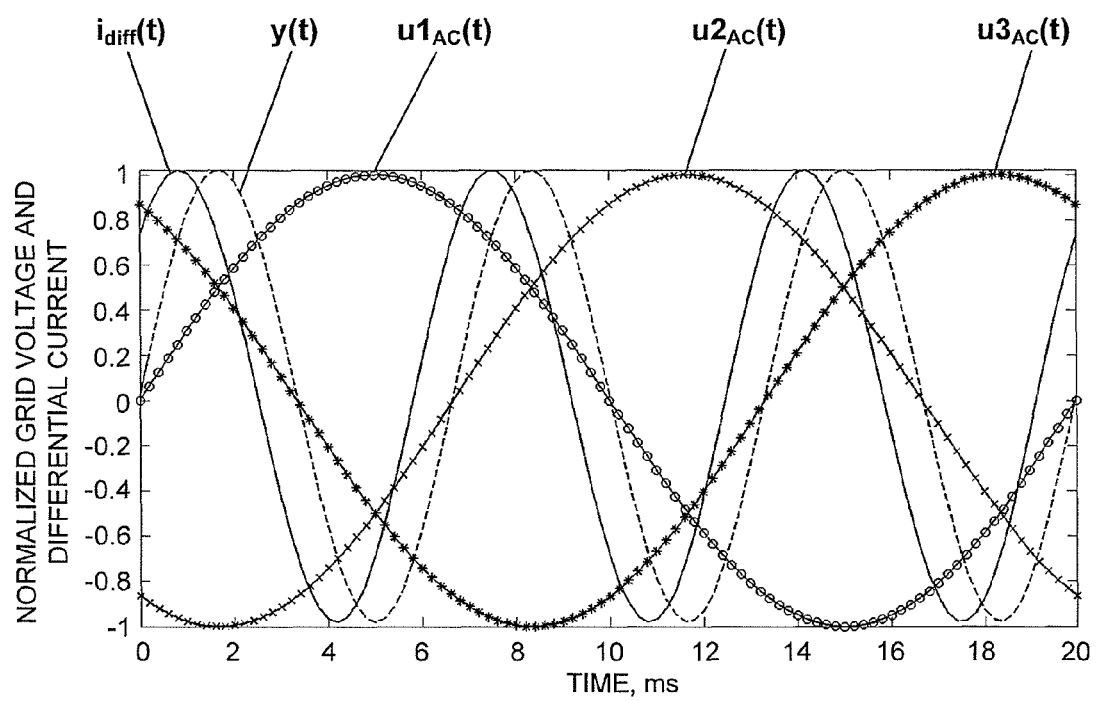
FIG. 3 shows the temporal course of AC voltages at AC current outputs of the inverter according to FIG. 1, of a differential current measured at the inverter, and of a reference function used in the method of the disclosure.

FIG. 3 shows the temporal course of the three AC voltages $u1_{AC}(t)$ to $u3_{AC}(t)$, of the differential current $i_{diff}(t)$ and of the reference function y(t) to be used in the normal operation of the inverter, which, like the AC voltages $u1_{AC}(t)$ to $u3_{AC}(t)$, is a sine function, and which has a zero crossing at each of the zero crossings of each of the three AC voltages $u1_{AC}(t)$ to $u3_{AC}(t)$. As the frequency of the reference voltage y(t) is exactly three times as high as those of the individual AC voltages $u_{AC}(t)$, it has no further zero crossings. For determining a first harmonic portion of the differential current $i_{diff}(t)$, one would have to use a reference function which is doubled in frequency with regard to the reference function y(t), and to multiply it by the differential current $i_{diff}(t)$.

The invention claimed is:

1. A method of determining a fault current portion $I_F$ in a differential current $i_{diff}(t)$ of an inverter, comprising:
measuring the differential current $i_{diff}(t)$ at the inverter;
measuring an AC voltage $u_{AC}(t)$ present at an AC current output of the inverter:
generating a periodic reference function y(t) of alternating sign as a function of the measured AC voltage $u_{AC}(t)$, wherein the reference function y(t), at least for one operating state of the inverter, has at least a predefined phase offset with respect to the measured AC voltage $u_{AC}(t)$ or has a frequency which is an integral multiple of the frequency of the measured AC voltage $u_{AC}(t)$;
multiplying the differential current $i_{diff}(t)$ by the reference function y(t) to form a product; and
averaging the product of the differential current $i_{diff}(t)$ and the reference function y(t) over an integral number of periods (T) of the reference function y(t) to determine an AC fault current portion $I_{F_{AC}}$ in the differential current $i_{diff}(t)$.

2. The method of claim 1, wherein the reference function y(t), at least for one operating state of the inverter in which semiconductor switches having anti-parallel diodes in an inverter bridge of the inverter are not switched, is generated with the predefined phase offset with respect to the AC voltage $u_{AC}(t)$.

3. The method of claim 1, wherein the inverter comprises n AC current outputs at which n AC voltages $u_{AC}(t)$ of a same frequency are present, wherein n is an integer greater than 1, and wherein the reference function y(t) is generated at a frequency which is at least n times as high as the frequency of the measured AC voltage $u_{AC}(t)$.

4. The method of claim 1, wherein the reference function y(t), at least for one operating state of the inverter in which semiconductor switches having anti-parallel diodes in an inverter bridge of the inverter are switched, is generated in such a way that zero crossings of the reference function y(t) coincide with zero crossings of the measured AC voltage $u_{AC}(t)$.

5. The method claim 1, wherein, for determining a further AC fault current portion in the differential current $i_{diff}(t)$, the method further comprises:
generating a further periodic reference function of alternating sign whose frequency is in an integral ratio to the frequency of the reference function y(t), wherein zero crossings of the further reference function coincide with zero crossings of the reference function y(t);
multiplying the differential current $i_{diff}(t)$ by the further reference function; and
averaging the product of the differential current $i_{diff}(t)$ and the further reference function over an integral number of periods of the further reference function.

6. The method claim 5, wherein the alternating fault current portion $I_{F_{AC}}$ and the further alternating fault current portion are geometrically added together to determine a total AC fault current portion in the differential current $i_{diff}(t)$.

7. The method claim 1, wherein the reference function y(t) is a sine function whose zero crossings are triggered by the zero crossings of the measured AC voltage $u_{AC}(t)$.

8. The method claim 7, wherein the reference function y(t) has a maximum value of $\sqrt{2}$.

9. The method claim 1, wherein the product of the differential current $i_{diff}(t)$ and the reference function y(t) is averaged over an integral number of periods T of the AC voltage $u_{AC}(t)$.

10. The method claim 1, further comprising determining a DC fault current portion $I_{F_{DC}}$ in the differential current $i_{diff}(t)$ by temporally averaging the differential current $i_{diff}(t)$.

11. The method claim 10, further comprising geometrically adding the DC fault current portion and the AC fault current portion $I_{F_{AC}}$ to determine a total fault current portion $I_F$ in the differential current $i_{diff}(t)$.

12. The method claim 1, further comprising separating all AC current outputs of the inverter at which AC voltages $u_{AC}(t)$ are present from an AC load or an AC power grid and/or switching off the inverter if the AC fault current portion $I_{F_{AC}}$ or the DC fault current portion $I_{F_{DC}}$ or the total fault current portion $I_F$ exceeds a current threshold value for a predetermined minimum period of time.

13. The method claim 1, further comprising measuring the differential current $i_{diff}(t)$ over all AC current outputs of the inverter.

14. An apparatus for determining a fault current portion $I_F$ in a differential current $i_{diff}(t)$ of an inverter, comprising:
a summation current transformer configured to measure a differential current $i_{diff}(t)$ at the inverter;
a measurement device configured to measure an AC voltage $u_{AC}(t)$ present at an AC current output of the inverter;
a signal generator configured to generate a periodic reference function y(t) of alternating sign as a function of the measured AC voltage $u_{AC}(t)$, the signal generator, at least for one operating state of the inverter, generating the reference function y(t) with at least a predefined phase offset with respect to the measured AC voltage $u_{AC}(t)$ or at a frequency which is an integral multiple of the frequency of the measured AC voltage $u_{AC}(t)$;
a multiplication knot configured to multiply the differential current $i_{diff}(t)$ by the reference function y(t); and
an averager configured to form an average value of the product of the multiplication knot over an integral number of periods T of reference function y(t).

15. The apparatus of claim 14, wherein the signal generator, at least for one operating state of the inverter in which a controller of the inverter does not switch semiconductor switches having anti-parallel diodes of an inverter bridge of the inverter, generates the reference function y(t) with the predefined phase offset with respect to the AC voltage $u_{AC}(t)$.

16. The apparatus of claim 14, wherein the inverter comprises n AC voltage outputs at which n AC voltages $u_{AC}(t)$ of a same frequency are present, wherein n is an integer greater than 1, and in that the signal generator generates the reference function y(t) at a frequency which is at least n times as high as the frequency of the measured AC voltage $u_{AC}(t)$.

17. The apparatus of claim 14, wherein the signal generator, at least for one operating state of the inverter in which a controller of the inverter switches semiconductor switches having anti-parallel diodes in an inverter bridge of the inverter, generates the reference function y(t) in such a way that zero crossings of the reference function y(t) coincide with zero crossing of the measured AC voltage $u_{AC}(t)$.

18. The apparatus of claim 14, further comprising:
a further signal generator for generating a further reference function y(t) whose frequency is in an integral ratio to the frequency of the reference function (y(t)), wherein zero crossings of the further reference function y(t) coincide with zero crossings of the reference function,
a further multiplication knot for multiplying the differential current $i_{diff}(t)$ by the further reference function, and
a further averager for generating an average value of the product of the further multiplication knot over an integral number of periods of the further reference function.

19. The apparatus of claim 18, further comprising a geometric adder configured to add the averaged product of the multiplication knot and the averaged product of the further multiplication knot.

20. The apparatus of claim 14, wherein the signal generator is a sine generator and is triggered by the zero crossings of the measured AC voltage $u_{AC}(t)$.

21. The apparatus of claim 14, further comprising an A/D converter configured to convert the differential current $i_{diff}(t)$ and the measured AC voltage $u_{AC}(t)$ from analog values to digital values, respectively.

22. The apparatus of claim 14, further comprising another averager configured to compute an average of the differential current $i_{diff}(t)$.

23. The apparatus of claim 22, further comprising a geometric adder configured to add the averaged differential current $I_{F_{DC}}$ and the geometric sum of the averaged products of all multiplication knots.

24. The apparatus of claim 14, wherein the averager comprises at least one integrator or low pass filter.

25. The apparatus of claim 14, wherein the summation current transformer is configured to measure the differential current $i_{diff}(t)$ between all AC current outputs of the inverter.

26. The apparatus of claim 14, further comprising a controller in the inverter, wherein the controller is configured to at least separate all AC current outputs of the inverter at which AC voltages $u_{AC}(t)$ are present from an AC load or an AC power grid or switch the inverter off, when the averaged product of a multiplication knot or the averaged differential current $i_{diff}(t)$ or an output signal of a geometric adder exceeds a threshold value for a predetermined minimum period of time.

* * * * *